United States Patent [19]

Yoshioka et al.

[11] 4,369,372
[45] Jan. 18, 1983

[54] PHOTO ELECTRO TRANSDUCER DEVICE

[75] Inventors: Seishiro Yoshioka; Yutaka Hirai, both of Tokyo; Tadaji Fukuda; Masaki Fukaya, both of Kawasaki; Takashi Nakagiri, Tokyo, all of Japan

[73] Assignee: Canon Kabushiki Kaisha, Tokyo, Japan

[21] Appl. No.: 160,170

[22] Filed: Jun. 17, 1980

[30] Foreign Application Priority Data

Jun. 18, 1979 [JP] Japan ................................. 54-76532
Jun. 27, 1979 [JP] Japan ................................. 54-82095

[51] Int. Cl.$^3$ ........................................... H01J 40/14
[52] U.S. Cl. ..................................... 250/578; 357/32
[58] Field of Search ............... 250/211 J, 578; 357/24, 357/15, 30, 31, 32; 358/212, 213

[56] References Cited

U.S. PATENT DOCUMENTS

3,400,272  9/1968  Dym et al. ..................... 250/211 J
3,900,716  8/1975  Kawabata et al. ............ 250/211 J
4,000,418  12/1976  Waldron et al. .................... 357/32

Primary Examiner—David C. Nelms
Attorney, Agent, or Firm—Fitzpatrick, Cella, Harper & Scinto

[57] ABSTRACT

This invention provides a photo electro transducer device having a photo electro transducer unit in which plural photo electro transducer elements having light receiving faces are arranged in an array, and a crosstalk preventing unit composed of diode elements respectively connected electrically to these photo electro transducer elements.

25 Claims, 31 Drawing Figures

PHOTO ELECTRO TRANSDUCER DEVICE

BACKGROUND OF THE INVENTION

1. Field of the Invention

The present invention relates to a photo electro transducer device, and more particularly to a solid-state photo electro transducer device adapted for use in the optical information input for facsimile, digital copier, laser recording apparatus etc. or in the optical reading device for a bar code reader or other character or image reading apparatus.

2. Description of the Prior Art

Along with the general trend for miniaturization of various apparatus, there has recently been observed a marked development, for use in the optical information input for facsimile, digital copier, laser recording apparatus or other character or image reading apparatus, of a photo electro transducer device provided with a so-called elongated photoreceptor face of a size equal or substantially equal to the size of the original image to be reproduced, showing a high image resolution enabling faithful reading of the original image and being still compact in size.

However such photo electro transducer device with an elongated photoreceptor face has a major difficulty in the signal processing circuits to be used in combination with the photo electro transducer unit in said device.

In fact such signal processing circuits require a significantly larger space than the photo electro transducer unit itself, so that the advantage of miniaturization resulting from the drastically shortened optical path length in such elongated photo electro transducer unit cannot be fully exploited.

In order to resolve this difficulty, there has usually been employed a system of dividing the photo electro transducer elements or pixels into plural blocks, connecting these blocks in a matrix and utilizing signal processing circuits of an amount corresponding to one block for driving all these blocks in succession.

Such matrix wiring system is however associated with the drawback of so-called crosstalk phenomenon, in which the signal of a desired pixel is contaminated with the signal of other pixels. This crosstalk phenomenon is usually prevented by the use of matrix diodes respectively connected in series with the photo electro transducer elements.

In such method, the electric signal obtained in response to the optical signal received by the photoreceptor face of the photo electro transducer element is supplied to the signal processing circuit while the crosstalk-preventing diode connected in series to said element is electrically biased to show the forward characteristic.

In general such crosstalk-preventing diode is required to have an inverse resistance, i.e. resistance under an inverse bias, approximately 100 times larger than the light resistance, i.e. resistance under light irradiation, of the photo electro transducer element, although this ratio is considerably dependent on the signal accumulating time.

Consequently in case the photo electro transducer element is made from a material with a relatively low charge mobility (0.01–10 cm$^2$/V·sec) and is required to be of a high sensitivity, said light resistance of the photo electro transducer element becomes inevitably high.

Accordingly the crosstalk-preventing diode is required to show a high inverse resistance, but it is extremely difficult to prepare the diodes of such characteristics.

In addition such photo electro transducer device utilizing the above-mentioned crosstalk-preventing diodes is associated with the electric matching and connections between each transducer element and the corresponding diode, particularly in case of a device with a large number of pixels and in case a high resolving power is required.

SUMMARY OF THE INVENTION

In consideration of the foregoing, the object of the present invention is to provide a solid-state photo electro transducer device which is provided with a photo electro transducer unit of a high resolving power and a high sensitivity having an elongated photoreceptor face and which is compact, inexpensive and adapted for mass production.

Another object of the present invention is to provide a solid-state photo electro transducer device with improved electric matching and connection between the photo electro transducer elements and the corresponding crosstalk-preventing diodes.

Still another object of the present invention is to provide a photo electro transducer device comprising a photo electro transducer unit in which n photo electro transducer elements having respective photoreceptor faces are arranged in an array and a crosstalk preventing unit provided with n diode elements respectively connected electrically to said transducer elements, wherein each of said n photo electro transducer elements is composed of one of n electrode areas A arranged in an array on a substrate, a photoreceptor layer provided on each of said electrode areas A, and an electrode area B provided on each of said photoreceptor layer, while each of said diode elements is composed of a semiconductor layer provided on corresponding electrode area A and an electrode area C provided on said semiconductor layer.

Still another object of the present invention is to provide a photo electro transducer device comprising a crosstalk-preventing diode structure portion composed of a photoreceptor layer and an electrode A provided on one face of said photoreceptor layer, a photo electro transducer portion composed of plural photo electro transducer elements arranged in an array and having a photodiode structure portion composed of said photoreceptor layer and an electrode B provided on the opposite face of said photoreceptor layer, means for causing said photo electro transducer elements to execute the photo electro transducer function, accumulating means for accumulating the signals released from said photo electro transducer elements, and transfer means for transferring the signals accumulated in said accumulating means.

BRIEF DESCRIPTION OF THE DRAWINGS

FIGS. 10(a-1), 10(b-1), 10(c-1), 10(d-1), 10(e-1), 10(f-1) and 10(g-1) and FIGS. 10(a-2), 10(b-2), 10(c-2), 10(d-2), 10(e-2), 10(f-2) and 10(g-2) are views showing the examples of the manufacturing process for producing the photo electro transducer portion and the crosstalk preventing portion of a structure shown in FIG. 9, wherein (a-1) to (g-1) are partial cross-sectional views along the chain line X-Y in FIG. 9, while (a-2) to (g-2) are partial front views seen from the direction of arrow A in FIG. 9;

DESCRIPTION OF THE PREFERRED EMBODIMENTS

Figure 1:
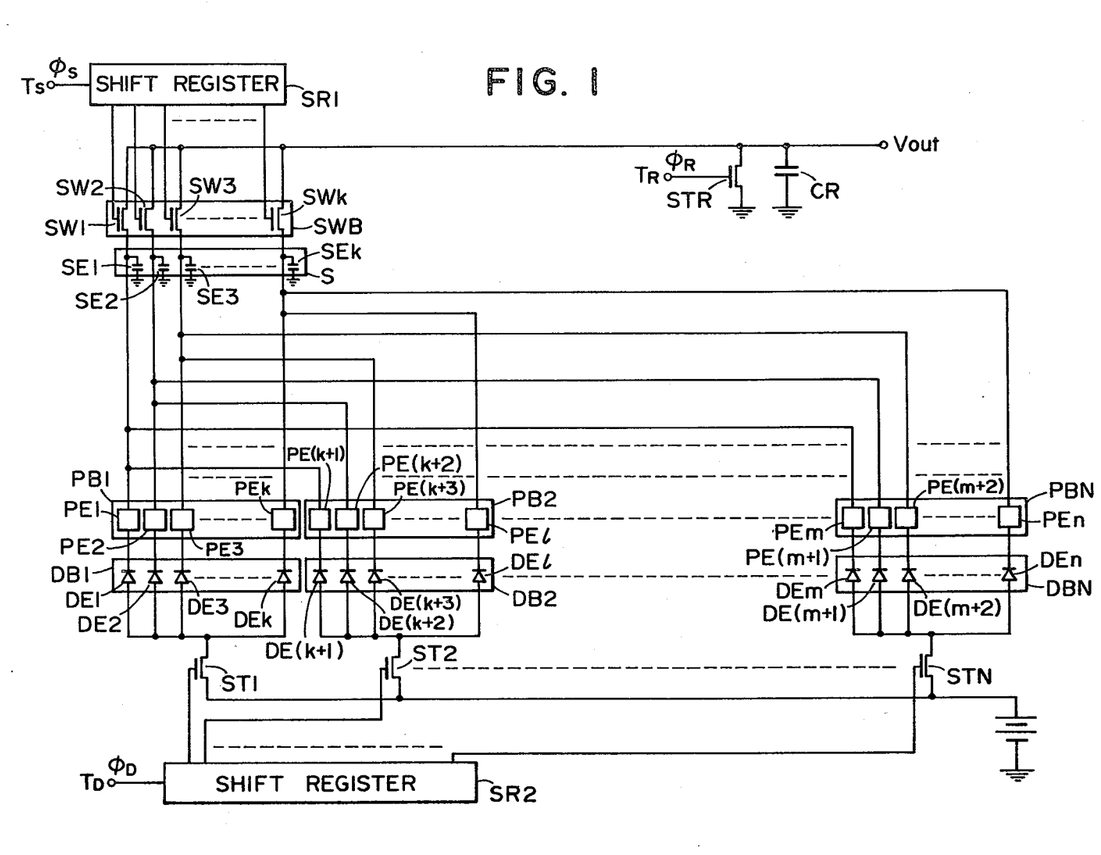
FIG. 1 is a circuit diagram showing the principal portion of a preferred embodiment of the photo electro transducer device of the present invention.

Reference is made to FIG. 1 showing the circuit diagram of the principal portion of a preferred embodiment of the photo electro transducer device of the present invention.

The device shown in FIG. 1 is provided with a photo electro transducer section composed of photo electro transducer elements PE of a number n arranged in a line with a constant pitch and divided equally into photo electro transducer blocks PB of a number N; a crosstalk preventing section composed of crosstalk preventing diode elements DE respectively connected in series to said photo electro transducer elements PE and divided in the above-mentioned manner into diode blocks DB of a number N; an accumulating or storage section S composed of storage elements SE of a number k each connected in series to the photo electro transducer elements of a same ordinal position in different blocks PB each containing k photo electro transducer elements; a switching element block SWB composed of switching elements SW of a number k for effecting the switching function for transferring the signals stored in the storage elements of the number k; a shift register SR-1 for causing successive switching functions of said k switching elements SW; switching elements ST of a number N respectively connected in series to the N diode blocks DB; and a shift register SR-2 for causing successive switching function of said N switching elements ST.

N photo electro transducer blocks (PB1, PB2, ..., PBN) are each composed of photo electro transducer elements PE of a number k and are mutually structured in the same manner, so that the optical information signals received by each transducer block PB are converted into electric signals in each block and time sequentially transferred to the storage section S from the corresponding transducer block. Prior to said signal transfer, the signals already stored in the storage section S are further transferred from said storage section S. This function is repeated in succession for each photo electro transducer block. Thus, for example at the signal transfer from the photo electro transducer block PB2 to the storage section S through the switching element ST2, the signals already received from the preceding transducer block PB1 and stored in the storage section S are released to the output prior to said signal transfer by successive switching functions of k switching elements SW1, SW2, ..., SWk constituting the switching element block SWB.

The signals sequentially transmitted by said switching function are accumulated as successive independent charges in a read-out condenser CR and are released as voltage signals from an output terminal $V_{out}$. Thus, in case a signal is supplied from the storage section S and accumulated in the readout condenser CR by the switching function of the switching element block SWB, the signal already stored in said readout condenser CR as a charge corresponding to the intensity of the optical information signal received by a corresponding photo electro transducer element is discharged by the function of a switching element STR which is activated by a signal $\phi_R$ received from a terminal $T_R$ after said accumulated signal is read as a voltage signal from the terminal $V_{out}$, whereby said readout condenser CR is prepared for accumulating the succeeding signal. Through the repetition of the above-explained procedure the signals stored in the storage section S are in succession transferred to the readout condenser CR and supplied from said output terminal $V_{out}$ as voltage signals corresponding to the changes accumulated in the readout condenser. The above-explained functions are executed by the supply of a signal $\phi_S$ to a terminal $T_S$, a signal $\phi_D$ to a terminal $T_D$ and a signal $\phi_R$ to a terminal $T_R$ at appropriate timings.

In the photo electro transducer device of the present invention, the n photo electro transducer elements PE constituting the photo electro transducer portion and the n diode elements DE constituting the crosstalk preventing portion are integrally formed on a single substrate. Said photo electro transducer element PE is formed by providing a photoreceptor layer and an electrode area B in succession on an electrode area A formed on said substrate. In order to form n photo electro transducer elements, there are provided, on said substrate, n electrode areas A at a determined pitch to form a straight array.

Said crosstalk preventing diode element DE is formed by providing a semiconductor layer and an electrode area C in succession on an end portion of said electrode area A so that said diode element is connected in series to the corresponding photo electro transducer element.

The photoreceptor layer contained in said photo electro transducer element PE is composed of a highly sensitive photoconductive material such as amorphous silicon hydride (hereinafter represented as a-Si:H), PbO, CdSe, $Sb_2S_3$, Se, Se-Te, Se-Te-As, Se-Bi, ZnCdTe, CdS, $Cu_2S$, amorphous germanium hydride, amorphous hydride of $Ge_xSi_{(1-x)}$ (wherein $0<x<1$) etc. In the present invention, the thickness of said photoreceptor layer is suitably determined according to the degree of diffusion of the photocarriers generated by incident optical information, and is usually selected in a range from 3000 Å to $2\mu$, preferably in a range from 5000 Å to $1.5\mu$. According to the present invention said photoreceptor layer is most preferably formed with a-Si:H in consideration of the advantages that the semiconductor layer constituting the diode element DE can also be formed with the same material as well be explained later, that a semiconductor of n- or p-type can be obtained by doping respectively with an element of the group VA in the periodic table such as N, P, As, Sb or Bi or with an element of the group IIIA in the periodic table such as B, Al, Ga, In or Tl, and that a p-n junction can be easily formed in the amorphous state.

Also according to the present invention, the semiconductor layer constituting said diode element DE is preferably formed with the same material as said photoreceptor layer for avoiding complexity and added cost in the manufacture and for achieving uniformity of the characteristics, but the present invention is not limited to such embodiment as long as the foregoing objects are achieved.

The material for forming said semiconductor layer is preferably selected from CdS, $Cu_2S$, CdSe, ZnCdTe, ZnSe, PbO, $Sb_2S_3$, Se, amorphous germanium hydride, amorphous hydride of $Ge_xSi_{(1-x)}$ (wherein $0<x<1$) etc. in consideration of the electric matching with the material employed for forming the photoreceptor layer.

The substrate on which said photo electro transducer elements and diode elements are formed is required to be translucent in case the optical information is supplied through said substrate to the photoreceptor face of the photo electro transducer portion, but such limitation becomes unnecessary in case the optical information is supplied directly to the photoreceptor face of the transducer portion formed on said substrate.

According to the present invention, the substrate can be made of various commercially available materials having sufficient flatness, surface smoothness, thermal resistance and resistance to various chemicals to be employed in the manufacture. Examples of such material are translucent materials such as glass, glass #7059(Dow Corning), magnesia, berylia, spinel, yttlium oxide etc. or opaque materials such as molybdenum, special stainless steel (SUS in Japan Industrial Standard), tantalum etc.

The material for the electrode area A to be formed on the substrate is selected in consideration of the physical and electrical properties for forming a required junction with the photoreceptor layer and with the semiconductor layer to be formed on said electrode area A. For example in case said photoreceptor layer and the semiconductor layer are formed with non-doped, n-type or i-type α-Si:H, the electrode area A may be composed for example of Au, Ir, Pt, Rh or Pd for forming a Shottky junction with said layers, Nb, Ta, V, Ti, Cr, Al, Mo or special stainless steel (SUS in the Japan Industrial Standard) for forming an ohmic junction with said layers, and of inorganic oxides such as $SnO_2$, ITO (indium-tin oxide) or $In_2O_3$ for forming a hetero junction with said layers. In case the photo electro transducer device of the present invention receives the optical information through the substrate, the electrode area A has to be made translucent by suitable selection of the layer thickness or of the material. In such case the crosstalk preventing portion composed of a plurality of diode elements is provided with light shielding means for preventing exposure to said optical information or other light.

In case the device receives the optical information through the substrate, said light shielding means may be composed either of an opaque metal layer provided between the substrate and the electrode area A or between the electrode area A and the semiconductor layer corresponding to the crosstalk preventing portion, or of an opaque metal or resin layer provided on the incident face of the substrate corresponding to the crosstalk preventing portion.

Also in case the optical information is directly introduced into the photoelectric converting portion, said light shielding means can be obtained by rendering the electrode areas C constituting the diode elements opaque to light by suitable selection of the thickness or the material, or covering the entire crosstalk preventing portion with a black paint such as apiezone wax through a transparent high-resistance layer with a high humidity resistance such as polyparaxylilene (Parylene from Union Carbide Corporation).

In addition, in such case, the above-mentioned object can be achieved by means of a light shielding hood for example formed of a plastic material and positioned on said crosstalk preventing portion, or by means of a light shielding plate provided between the photo electro transducer portion and the crosstalk preventing portion.

The electrode area B, in case the optical information is received from the side of the photo electro transducer portion, is made translucent by means of suitable selection of the thickness or the material.

The photo electro transducer device of the present invention is classified into the following four types according to the junction state of the photoreceptor layer constituting the photo electro transducer element with the electrode areas provided on both sides thereof, and also to the junction state of the semiconductor layer constituting the diode element with the electrode areas provided on both sides thereof:

(1) Shottky junction type
(2) Hetero junction type
(3) Homo junction type
(4) Hybrid type Now there will be explained preferred embodiments of the photo electro transducer portion and the crosstalk preventing portion featuring the characteristics of the present invention, while making reference to FIGS. 2 to 8 showing the structure of said portions in schematic cross-sectional views.

Figure 2:
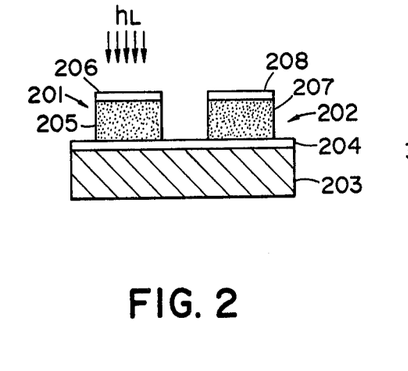
FIGS. 2, 3, 4, 5, 6, 7 and 8 are schematic cross-sectional views showing the structure of the photo electro transducer portion and the crosstalk preventing portion in the preferred embodiments.

FIG. 2 shows a preferred representative embodiment employing shottky junctions.

In FIG. 2, the photo electro transducer elements 201 constituting the photo electro transducer portion and the diode elements 202 constituting the crosstalk preventing portion, both constituting in combination the principal part of the photo electro transducer device of the present invention, are formed by providing a photoreceptor layer 205 and a semiconductor layer 207 separately on each of n electrode areas A 204 arranged in a linear array on a substrate 203, and forming the electrode area B206 and electrode area C208 respectively on said layers.

The electrode area A204 is connected by an ohmic junction with said photoreceptor layer 205 and semiconductor layer 207, while said layers are respectively connected by Shottky junctions with the electrode area B and electrode area C.

In the photoelectric converting device as shown in FIG. 2, the electrode area B206 is made translucent as the optical information is introduced therethrough to the photoelectric converting element 201.

Also in such device as shown in FIG. 2, the use of a stainless steel substrate allows formation of an ohmic junction without the electrode area A204, so that the substrate itself can be utilized as the electrode area A.

Figure 3:
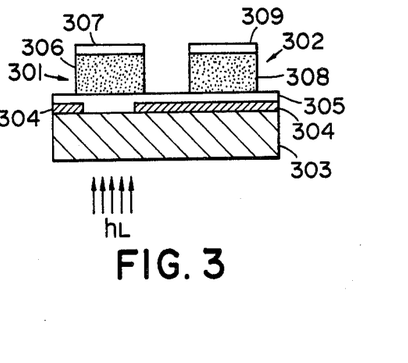

FIG. 3 shows a transducer device utilizing Shottky junctions in which the optical information is introduced through the substrate.

The device shown in FIG. 3 is different from that shown in FIG. 2 in that an opaque metal layer 304 is provided between the substrate 303 and the electrode area A305 as light shielding means for preventing the light introduction into the diode element 302, and in that the materials are so selected that the photoreceptor layer 306 and the semiconductor layer 308 form shottky junctions with the electrode area A 305 and also form ohmic junction respectively with the electrode area B 307 and electrode area C 309.

Such transducer device as shown in FIG. 3 designed for receiving the optical information through the substrate 303 is advantageous, in the use as an original reading device in a facsimile apparatus or a digital copier, in preventing the mechanical damage to the photo electro transducer elements 301 and diode elements 302, since the scanning of an original is conducted at the side of substrate 303.

Consequently the transducer device of this type is most suitable for so-called contact type reading device in which the photoreceptor face of the photo electro transducer portion is maintained at close proximity of the original to be scanned.

Figure 4:
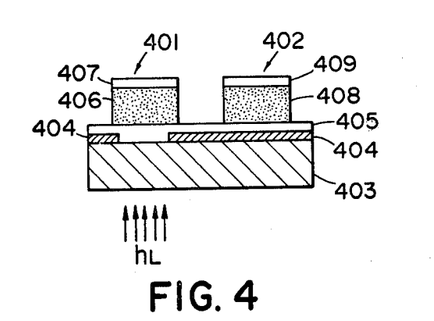
Figure 5:
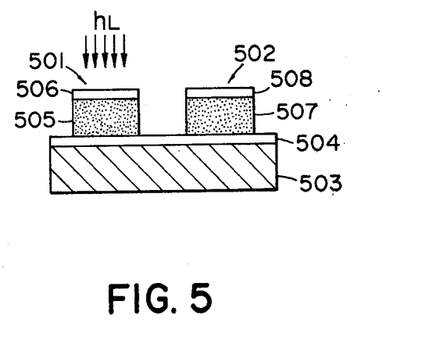

FIGS. 4 and 5 show the photo electro transducer devices utilizing hetero junctions, in which the optical information is introduced through the substrate in case of FIG. 4, and introduced directly to the photo electro transducer portion in case of FIG. 5.

The device shown in FIG. 4 represents a most preferred embodiment of the present invention.

In the device shown in FIG. 4, there is provided an opaque metal layer 404 on the substrate 403 except the areas constituting the photoreceptor face of the photo electro transducer element 401, and the electrode area A 405 is formed on said metal layer 404.

The materials and thickness of said opaque metal layer 404 and electrode area A 405 are so selected that they show a satisfactory adhesion and form an optically smooth junction.

The photoreceptor layer 406 and the semiconductor layer 408 provided on the electrode area A 405 are formed with suitable materials forming hetero junctions with said electrode area A 405.

For example in case the electrode area A 405 is formed by SnO$_2$ or ITO, the photoreceptor layer 406 and semiconductor layer 408 can be composed of non-doped α-Si:H, or α-Si:H slightly doped with an element of the group VA of the periodic table, or α-Si:H heavily doped with an element of the same group for obtaining n+ type property in the electrode area B and electrode area C, so as to achieve the required photolectric and electric properties.

The electrode area B 407 and the electrode area C 409 respectively formed on the photoreceptor layer 406 and the semiconductor layer 408 are formed by the material so selected as to form ohmic junctions therewith. For example, in case the photoreceptor layer 406 and the semiconductor layer 408 are formed by such materials as mentioned above, said electrode areas can be composed of any material suitably selected from Nb, Ta, V, Ti, Cr, Mo, Al, stainless steel etc.

Plural sets, of a number n, of the above-explained photo electro transducer element 401 and diode element 402 are formed on the substrate 403 to constitute a photo electro transducer device for n pixels.

As explained in the foregoing the crosstalk preventing portion is provided with light shielding means composed of the opaque metal layer 404, but the crosstalk preventing portion may further be entirely sealed, for the purpose of completely avoiding the stray light entering said portion, with a resin paint such as black apiezone wax which is provided over a moisture-resistant and high-resistance transparent layer for example composed of polyparaxylilene (Parylene supplied by Union Carbide Corporation). In such case said resin paint layer functions also for mechanically protecting said crosstalk preventing portion.

The substrate 403, through which the optical information is introduced, is prepared by such material and such working as to allow the introduction of the optical information with the desired optical properties to the photoreceptor face of the photo electro transducer elements 401. In case the opaque metal layer 404, electrode area A 405, photoreceptor layer 406 and semiconductor 408 are to be formed thereon under high-temperature conditions, the substrate 403 has to be composed of a thermally stable material. Also in case the transducer device is utilized as a contact-type reading device, the substrate 403 is preferably composed for example of a fiber plate or an acute lens plate in order to prevent the deterioration in the resolving power resulting from optical diffusion of the optical information in said substrate 403.

FIG. 5 shows a photo electro transducer device utilizing hetero junctions in which the optical information is introduced directly to the photo electro transducer portion.

The materials for the electrode area A 504 to be formed on the substrate 503 and for the photoreceptor layer 505 and semiconductor layer 507 formed on said electrode area A are so selected as to form ohmic junctions between said layers and the electrode area A.

Also there are formed hetero junctions between the photoreceptor layer 505 and the electrode area B, and between the semiconductor layer 507 and the electrode area C 508.

Other structual and manufacturing conditions than explained above are similar to those explained in relation to FIGS. 2 to 4. However, in order to prevent the undesirable thermal effect on the photoelectric or electric properties of the photoreceptor layer 505 and semiconductor layer 507 at the formation thereon of the electrode areas B and C with hetero junctions therebetween it is necessary either to select suitable materials allowing to prevent such thermal deterioration for said layers in case the electrode area B and C are to be prepared under high-temperature conditions, or to select suitable material for said electrode areas B and C allowing low-temperature formation thereof.

Figure 6:
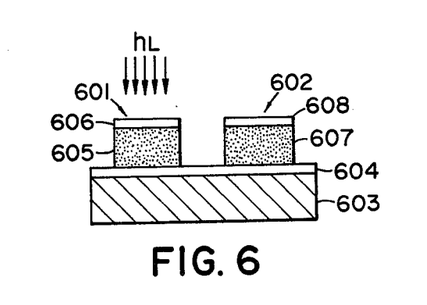

The photo electro transducer device shown in FIG. 6 is fundamentally different from those explained in the foregoing in that it is provided with homo junctions respectively in the photoreceptor layer 605 constituting the photo electro transducer element 601 and in the semiconductor layer 607 constituting the diode element 602, both in the layer structure thereof. The formation of such homo junctions in the photoreceptor layer 605 and semiconductor layer 607 is rendered possible if these layers are composed of a material allowing p/n type control, for example α-Si:H. Thus p-n junctions are formed in the photoreceptor layer 605 and semiconductor layer 607 by forming a p-type α-Si:H layer and a n-type α-Si:H layer in succession on the electrode area A 604.

It is also possible to form such homo junction between an i-type α-Si:H layer and a p-type or n-type α-Si:H layer, or further to form two homo junctions by the combination for example of p-type, n-type and p-type α-Si:H layers. In case of α-Si:H these layers can be formed continuously as the formation of p-type or n-type layer is easily achievable by the aforementioned doping during the layer formation.

The homo junction formed in the photoreceptor layer 605 is preferably positioned, in consideration of the photo electro transducer efficiency, in the vicinity of the face receiving the optical information.

Figure 7:
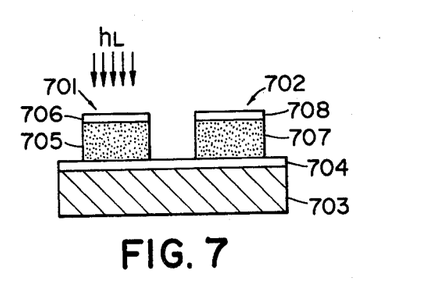
Figure 8:
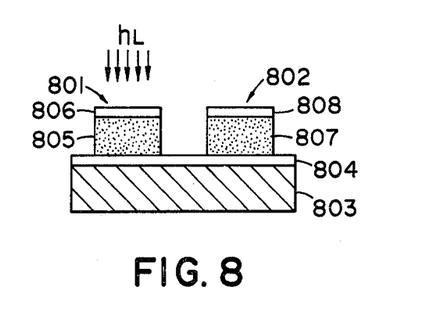

The photo electro transducer devices shown in FIGS. 7 and 8 are of hybrid type and are substantially same as those already explained in relation to FIGS. 2 to 6 except for the following point.

The devices shown in FIGS. 7 and 8 are characterized in that the photo electro transducer element and the diode element have an asymmetric structure in contrast to the embodiments shown in FIGS. 2 to 6 in which the structure is symmetric.

More specifically, in the device shown in FIG. 7, while the photo electro trausducer element 701 contains ohmic junctions between the electrode area A 703 and the photoreceptor layer 705, and between said layer and the electrode area B 706, the diode element 702 contains an ohmic junction between the electrode area A 704 and the semiconductor layer 707 and a Shottky junction between the semiconductor layer 707 and the electrode area C 708.

The device shown in FIG. 8 also has an asymmetric structure in which the photo electro transducer element 801 contains ohmic junctions between the electrode area A 804 and the photoreceptor layer 805 and between said layer and the electrode area B808, while the diode element 802 contains an ohmic junction between the electrode area A 804 and the semiconductor layer 807 and a hetero junction between said semiconductor layer 807 and the electrode area C 808.

Now there will be explained examples of manufacturing process for the photo electro transducer portion and the crosstalk preventing portion which are the principal parts of the photo electro transducer device of the present invention.

Figure 9:
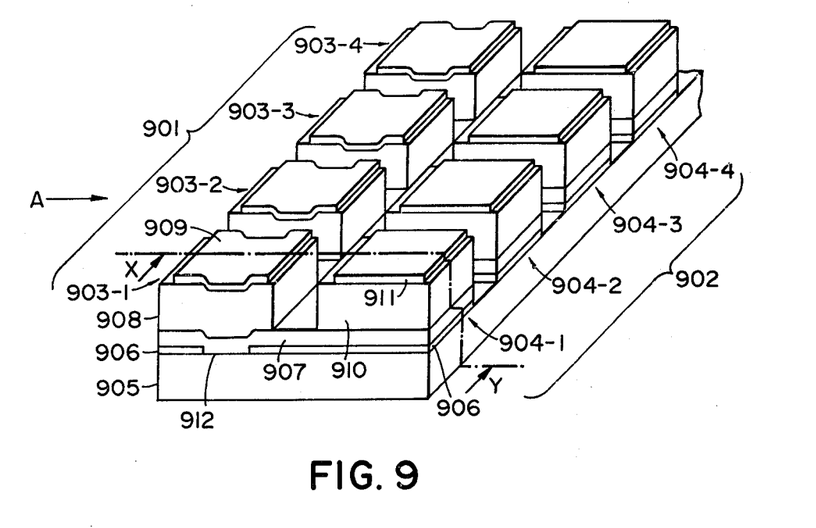
FIG. 9 is a perspective view schematically showing a part of the photo electro transducer portion and the crosstalk preventing portion.

FIG. 9 shows, in a schematic perspective view, a part of the photo electro transducer portion and the crosstalk preventing portion of the device shown in FIG. 4.

On a substrate 905, there are integrally formed the photo electro transducer portion 901 and the crosstalk preventing portion 902 according to the manufacturing process to be explained later.

Although FIG. 9 shows only four photo electro transducer elements 903 and four diode elements 904 respectively constituting the converting portion 901 and the crosstalk preventing portion 902, there are in fact provided 3360 converting elements 903 and diode elements 904 of the same number to form a linear array for example in case the photoreceptor face has a total length of 210 mm with a resolving power of 16 pixels/mm. The converting elements or diode elements are mutually isolated by spacings of for example 10 microns for preventing mutual electric interference. The photo electro transducer portion 901 and the crosstalk preventing portion 902 should be separated as widely as possible in order to prevent the light introduction into the latter. However the distance between the photo electro transducer element 903 and the diode element 904 is limited by the electric resistance of the electrode area A 907 therebetween. In case the photo electro transducer element 903 is separated by a sufficient space from the diode element 904 in this manner, it is rendered possible to fill said space with a highly insulating opaque material to constitute the light shielding means, or to provide a light shielding plate in said space.

The distance between the photo electro transducer element 903 and the diode element 904 is generally selected, in the above-explained manner, longer than 5 mm, and preferably longer than 10 mm.

Another preferred embodiment of the light shielding means for the crosstalk preventing portion 902 is obtained by coating the photo electro transducer portion 901 and the crosstalk preventing portion 902 with a moisture-resistant insulating translucent material such as polyparaxylilene for providing a sufficient moisture resistance, and further covering said coating with an opaque material such as apiezone wax except for the photoreceptor 912 into which the optical information is introduced.

The opaque metal layer 906 provided as the light shielding means is either formed corresponding to the electrode area A 907 but except the photoreceptor face 912 of the photo electro transducer portion 901 as shown in FIG. 9, or formed over the entire surface of the substrate 905 except said photoreceptor face 912.

The material and thickness of said metal layer 906 are selected in consideration of the opacity thereof and the adhesion to the substrate 905 and to the electrode area A 907.

Preferred examples of the material for said opaque metal layer 906 are chromium, aluminum-gold, chromium-gold, nickel-chromium, molybdenum etc.

Figure 10:
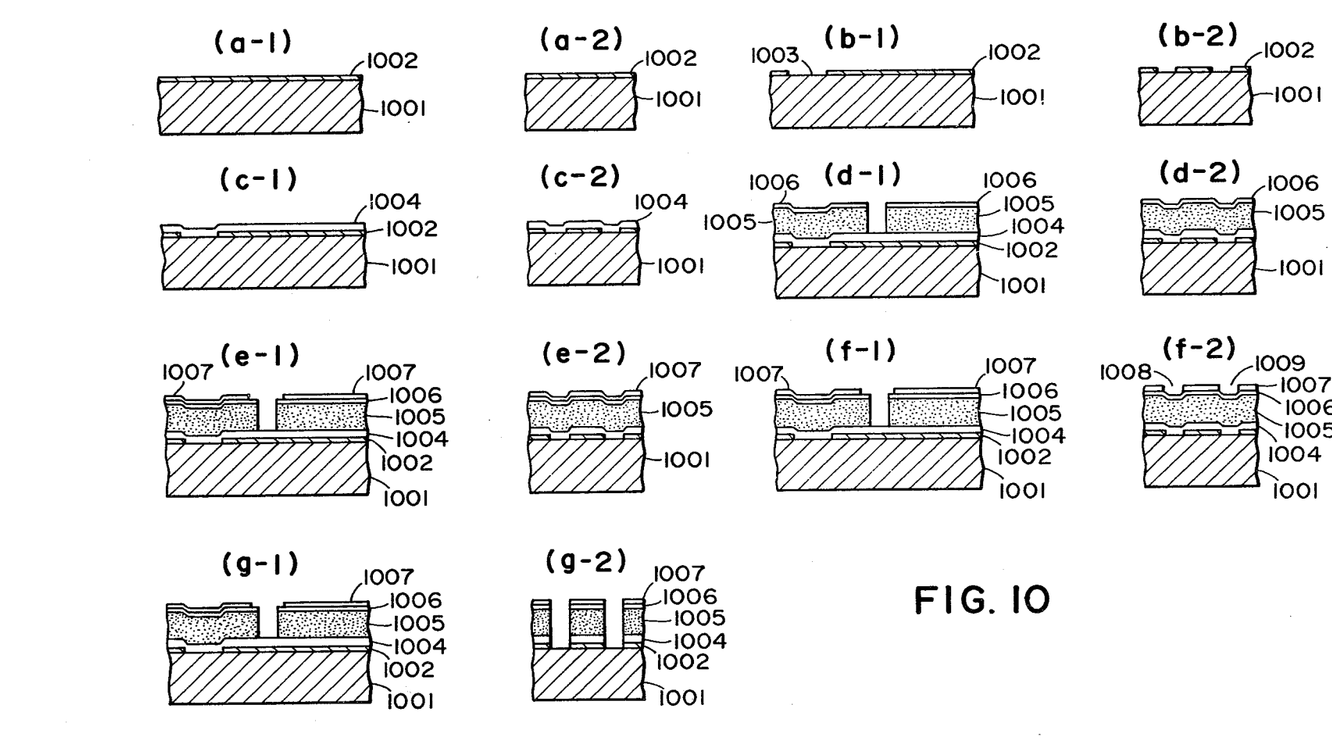

In the following there will be explained is an example of the manufacturing process for the photo electro transducer portion and the crosstalk preventing portion shown in FIG. 9, while making particular reference to FIG. 10 wherein the views (a-1) to (g-1) are partial cross-sectional views along the chain line X-Y in FIG. 9 while the views (a-2) to (g-2) are front views seen from the direction of arrow A in FIG. 9.

In said process a substrate 1001 made of glass #7059 (Dow Corning) is subjected to vacuum evaporation of chromium layer 1002 of a thickness of 2000 Å (step a), and a light-receiving window 1003 for receiving the optical information is formed by photoetching technology (step b). Subsequently an ITO (indium-tin oxide) tranparent conductive layer 1004 of a thickness of 1000 Å is deposited thereon by ion plating (step c). On said conductive layer there is selectively formed an α-Si:H layer 1005 of a thickness of 1 micron by the decomposition of SiH₄ gas through a metal mask by glow discharge, and subsequently formed is an n+-type α-Si:H layer 1006 of a thickness of 1000 Å showing strong n-type conduction by means of the decomposition of SiH₄ gas mixed with 0.1% amount of PH₃ gas, thereby completing the photoreceptor layer and the semiconductor layer (step d). Then an Al layer 1007 is vacuum evaporated selectively through a metal mask in a thickness of 2000 Å (step e).

Subsequently the unnecessary portions 1008, 1009 of the layers of Al, α-Si:H and ITO for each pixel by photoetching (steps f, g) to complete the integral photo electro transducer portion and crosstalk preventing portion.

Figure 11:
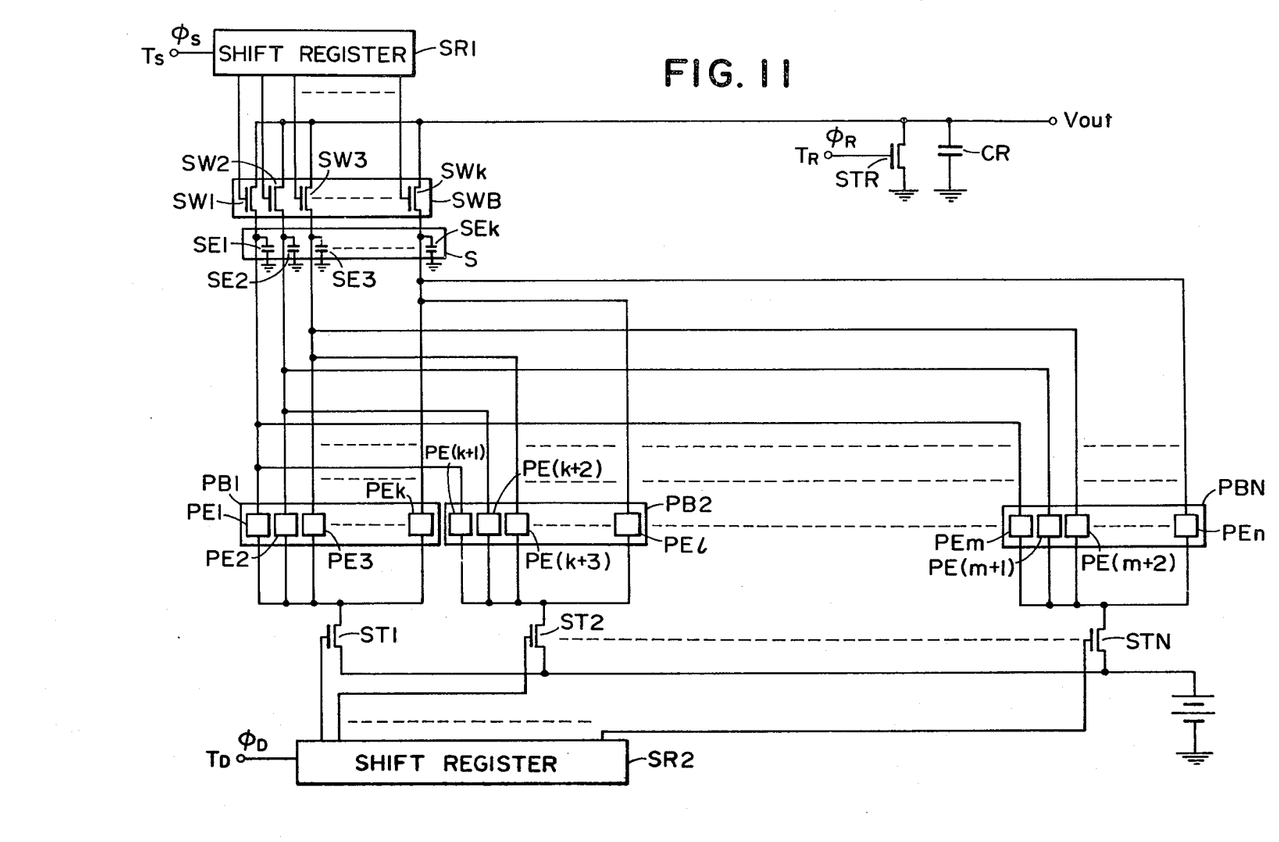
FIG. 11 is a circuit diagram showing the principal portion of another preferred embodiment of the photo electro transducer device of the present invention.

The photo electro transducer device shown in the circuit diagram of FIG. 11 is provided with photo electro transducer elements PE of a number n comprising n photo electro transducer photodiodes arranged in a linear array of a constant pitch and crosstalk preventing diodes formed integrally therewith, said converting elements PE being divided equally into N photo electro transducer blocks PB each containing k converting elements PE, a storage section S composed of k storage elements SE respectively connected in series to the converting elements PE of a same ordinal position in said blocks PB, a switching element block SWB composed of k switching elements SW for transferring the signals stored in k storage elements, a shift register SR-1 for causing successive switching function of said k switching elements SW, N switching element ST respectively connected in series to said N photo electro transducer blocks PB, and a shift register SR-2 for causing successive switching function of said N switching elements ST.

Said N photo electro transducer blocks (PB1, PB2, . . . , PBN) are respectively composed of k photo electro transducer elements PE and are similarly structured, so that the optical information signals introduced into each block PB are subjected to photoelectric conversion in respective block and time sequentially transferred to the storage section S. Prior to said signal transfer, the signals previously stored in said storage section S are further transferred therefrom. This procedure is repeated for each photo electro transducer block. Thus, for example in case of the signal transfer from the converting block PB2 to said storage section S through the switching element ST2, the signals previously received from the converting block PB1 and stored in said storage section 1 are supplied to the output circuit by successive switching functions of k switching elements SW1, SW2, . . . , SWk constituting the switching element block SWB prior to said signal transfer.

The signals sequentially transmitted by said switching function are accumulated as successive independent charges in a read-out condenser CR and are released as voltage signals from an output terminal $V_{out}$. Thus, in case a signal is supplied from the storage section S and accumulated in the read-out condenser CR by the switching function of the switching element block SWB, the signal already stored in said read-out condenser CR as a charge corresponding to the intensity of the optical information signal received by a corresponding photo electro transducer element is discharged by the function of a switching element STR which is activated by a signal $\phi_R$ received from a terminal $T_R$ after said accumulated signal is read as a voltage signal from the terminal $V_{out}$, whereby said read-out condenser CR is prepared for accumulating the succeeding signal. Through the repetition of the above-explained procedure the signals stored in the storage section S are in succession transferred to the read-out condenser CR and supplied from said output terminal $V_{out}$ as voltage signals corresponding to the charges accumulated in the read-out condenser. The above-explained functions are executed by the supply of a signal $\phi_S$ to a terminal $T_S$, a signal $\phi_D$ to a terminal $T_D$ and a signal $\phi_R$ to a terminal $T_R$ at appropriate timings.

The photoreceptor layer constituting the photo electro transducer element PE is composed of the aforementioned photoconductive material, such as a-Si:H, PbO, CdSe, Sb$_2$S$_3$, Se, Se-Te, Se-Te-As, Se-Bi, ZnCdTe, CdS, Cu$_2$S, amorphous germanium hydride, or amorphous hydride of Ge$_x$Si$_{(1-x)}$. The thickness of the photoreceptor layer is selected, in consideration of the extent of diffusion of photocarriers generated by the optical information and in view of achieving complete or substantially complete prevention of light introduction to the crosstalk preventing diode provided opposite to the information receiving face, generally in a range from 4000 Å to 2$\mu$, preferably in a range from 6000 Å to 1.5$\mu$.

The substrate on which the photo electro transducer elements PE are formed is required to be translucent in case the optical information is introduced through the substrate to the photoreceptor face of the photo electro transducer photodiodes, but such limitation becomes unnecessary in case the optical information is introduced directly to the photoreceptor face of said converting photodiodes.

The substrate can be composed of a material suitably selected from those explained in the foregoing, and is required to satisfy the aforementioned requirements for the flatness, surface smoothness, thermal resistance and resistance to chemicals to be employed in the manufacture.

FIGS. 12 to 18 show the structure, in schematic cross-sectional views, of the photo electro transducer photodiode portion and the crosstalk preventing diode portion which constitute the principal part of the photo electro transducer device shown in FIG. 11.

Figure 12:
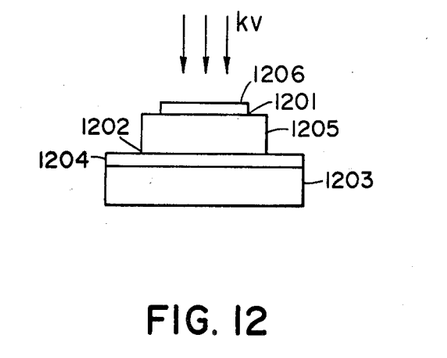
FIGS. 12, 13, 14, 15, 16 and 17 are schematic cross-sectional views of preferred embodiments of the photo electro transducer photodiode portion and the crosstalk preventing diode portion of the device shown in FIG. 11.

FIG. 12 shows a representative preferred embodiment of the device employing Shottky junctions, in which the photo electro transducer photodiode elements 1201 constituting the photo electro transducer portion and the diode elements 1202 constituting the crosstalk preventing portion are formed by providing a photoreceptor layer 1205 and an electrode area B 1206 in succession on each of the electrode areas A 1204 of a number n arranged in a linear array on a substrate 1203, wherein Shottky junctions are formed between the photoreceptor layer 1205 and the electrode area A 1204 or the electrode area B 1206.

In the device as shown in FIG. 12, the electrode area B is made translucent since the optical information is introduced to said photo electro transducer photodiode elements 1201 through said electrode areas B 1206.

Figure 13:
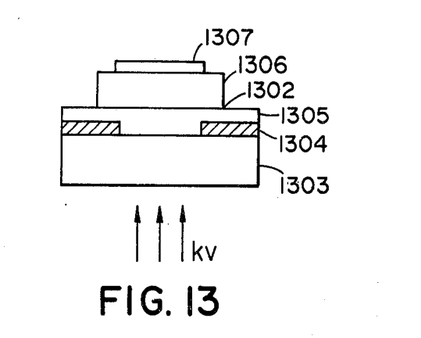

FIG. 13 shows a device utilizing Shottky junctions in which the optical information is introduced through the substrate.

The device shown in FIG. 13 is different from that shown in FIG. 12 in that there is provided an opaque metal layer 1304 between the substrate 1303 and the electrode area A 1305 for limiting the light introduction into the photodiode element 1302, and the electrode area B 1307 needs no longer to be translucent but is rather preferably opaque.

Such converting device as shown in FIG. 13 designed to receive the optical information through the substrate 1303 is advantages, in the use as an original reading device in a facsimile apparatus or a digital copier, in preventing the mechanical damage to the photo electro transducer device, since the scanning of an original is conducted at the side of substrate 1303.

Consequently the converting device of this type is most suitable for a so-called contact type reading device in which the photoreceptor face of the photo electro transducer photodiodes in which the photoreceptor face of the photo electro transducer photodiodes is maintained in close proximity of the original to be scanned.

Figure 14:
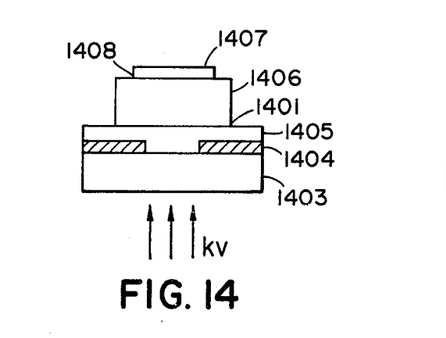
Figure 15:
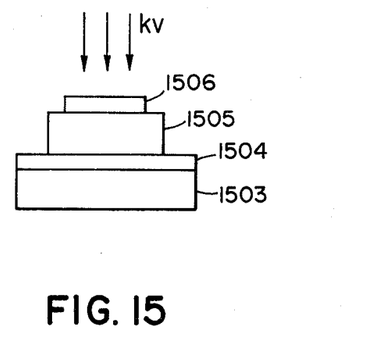

FIGS. 14 and 15 show the photo electro transducer devices utilizing hetero junctions, in which the optical information is introduced through the substrate in case of FIG. 14, while it is introduced directly to the photo electro transducer portion in case of FIG. 15.

The device shown in FIG. 14 represents a most preferred embodiment of the present invention.

In the device shown in FIG. 14, there is provided an opaque metal layer 1404 on the substrate 1403 except the areas constituting the photoreceptor face of the photo electro transducer element 1401, and the electrode area A 1405 is formed on said metal layer 1404.

The material and thickness of said opaque metal layer 1404 and electrode area A 1405 are so selected that they show a satisfactory adhesion and form an optically smooth junction.

The photoreceptor layer 1406 to be formed on the photoreceptor layer 1406 is composed of a material forming a hetero junction with said electrode area A 1405.

For example in case the electrode area A 1405 is formed by $SnO_2$ or ITO, the photoreceptor layer 1406 and semiconductor layer 1408 can be composed of non-doped α-Si:H or α-Si:H slightly doped with an element of the group VA of the periodic table.

The material for the electrode area B 1407 to be formed on the photoreceptor layer 1406 is so selected as to form a hetero junction therewith, and can be $SnO_2$ or ITO in case the photoreceptor layer 1406 is formed of the materials explained above.

Plural sets, of a number n, of the above-explained integral layered structure of the photo electro transducer photodiode element 1401 and the crosstalk preventing diode element 1408 are formed on the substrate 1403 to complete the photo electro transducer device of n pixels.

In order to completely avoid any incident light to the crosstalk preventing portion, the electrode area B 1407 and the exposed photoreceptor layer 1406 may be entirely sealed by means of a resin paint such as black apiezone wax which is to be provided over a moisture-resistant transparent insulating layer for example composed of polyparaxylilene such as Parilene (Union Carbide Corporation). In such case said resin paint layer may also function for mechanical protection of the crosstalk preventing portion.

The substrate 1403, through which the optical information is introduced, is prepared by such material and such working as to allow the introduction of the optical information with the desired optical properties to the photoreceptor face of the photo electro transducer photodiode elements 1401. In case the opaque metal layer 1404, electrode area A 1405 and photoreceptor layer 1406 are to be formed thereon under high-temperature conditions, the substrate 1403 has to be composed of a thermally stable material. Also in case the converting device is utilized as a contact-type reading device, the substrate 1403 is preferably composed for example of a fiber plate or an acute lens plate in order to prevent the deterioration in the resolving power resulting from optical diffusion of the optical information in said substrate 1403.

FIG. 15 shows a photo electro transducer device utilizing hetero junctions in which the optical information is introduced through the electrode area B 1506.

The materials for the electrode area A 1504 to be formed on the substrate 1503 and for the photoreceptor layer 1505 are so selected that a hetero junction is formed between the electrode area A 1504 and the photoreceptor layer 1505.

Also a hetero junction is formed between said photoreceptor layer 1505 and the electrode area B 1506.

Figure 16:
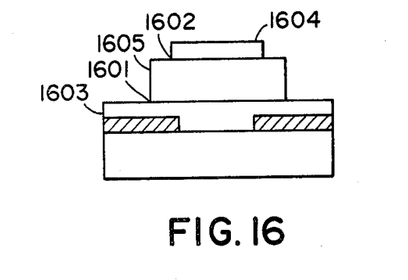
Figure 17:
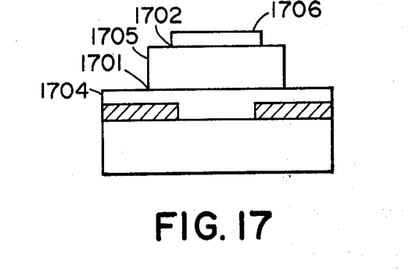

The photo electro transducer devices shown in FIGS. 16 and 17 are of hybrid type and are substantially same as those already explained in relation to FIGS. 12 to 15 except for the following point.

The devices shown in FIGS. 16 and 17 are characterized in that the photo electro transducer photodiode element and the crosstalk preventing diode element have an asymmetric structure in contrast to the embodiments shown in FIGS. 12 to 15 in which the structure is symmetric.

More specifically, in the device shown in FIG. 16, while the photo electro transducer photodiode element 1601 contains a hetero junction between the electrode area A 1603 and the photoreceptor layer 1605, the crosstalk preventing diode element 1602 contains a Shottky junction between the electrode area B 1604 and the photoreceptor layer 1605.

The device shown in FIG. 17 also has an asymmetric structure in which the photo electro transducer photodiode element 1701 contains a Shottky junction between the electrode area A 1704 and the photoreceptor layer 1705, while the crosstalk preventing diode element 1702 contains a hetero junction between the electrode area B 1706 and the photoreceptor layer 1705.

In the following there will be explained is an example of the manufacturing process for the photo electro transducer photodiode portion and the crosstalk preventing diode portion which constitute the principal part of the above-explained photo electro transducer device.

Figure 18:
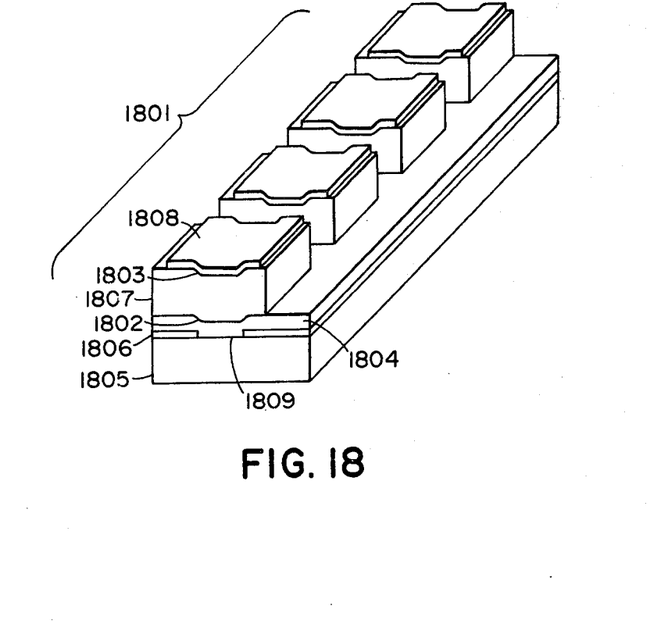
FIG. 18 is a perspective view showing schematically a part of the photo electro transducer diode portion and the crosstalk preventing diode portion as shown in FIG. 18.

FIG. 18 shows, in a schematic perspective view, a part of the photo electro transducer photodiode portion and the crosstalk preventing diode portion of the device as shown in FIG. 16 to be prepared according to the following process.

On the substrate 1805, the photo electro transducer photodiode portion 1802 and the crosstalk preventing portion 1803 are integrally formed by the process to be explained in the following.

Although FIG. 18 shows only four photo electro transducer elements having the photo electro transducer photodiode portion 1802 and the crosstalk preventing diode portion 1803, there are in fact provide 3360 converting elements to form a linear array for example in case the photoreceptor face has a total length of 210 mm with a resolving power of 16 pixels/mm. In such case said converting elements are mutually separated for example by a space of approximately 10 microns for preventing mutual electrical interference between said elements.

A preferred embodiment of the light shielding means for the crosstalk preventing diode portion 1803 is obtained by coating the electrode area B 1808 and the exposed photoreceptor layer 1807 entirely with a moisture-resistance transparent insulating material such as polyparaxylilene and further coating with an opaque material such as apiezone wax except for the photoreceptor face 1809 of the photodiode portion 1802 to which the optical information is introduced.

The opaque metal layer 1806 provided as the light shielding means is formed corresponding to the electrode area A 1804 except for the photoreceptor face 1809 of the photodiode portion 1802 as shown in FIG. 18.

The material and thickness of said metal layer 1806 are determined in consideration of the opacity and the adhesion to the substrate 1805 and the electrode area A 1804.

Preferred examples of the material for said opaque metal layer 1806 are chromium, aluminum-gold, chromium-gold, nickel-chromium, molybdenum etc.

What we claim is:

1. A photo electro transducer device comprising a photo electro transducer portion having n photo electro transducer elements provided with photoreceptor faces and arranged in an array and a crosstalk preventing portion having n diode elements electrically connected respectively to said n photo electro transducer elements, wherein each of said n photo electro transducer elements is composed of one of n electrode areas A arranged in an array on a substrate, a photoreceptor layer provided on said electrode area A and an electrode area B provided on said photoreceptor layer, and wherein each of said diode elements is composed of a portion of said electrode area A, an electrode area C and a semiconductor layer provided between said electrode areas A and C.

2. A photo electro transducer device according to claim 1, wherein ohmic junctions are formed between said electrode area A and said photoreceptor layer and between said electrode area A and said semiconductor layer, and Shottky junctions are formed between said photoreceptor layer and said electrode area B and between said semiconductor layer and said electrode area C.

3. A photo electro transducer device according to claim 1, wherein Shottky junctions are formed between said electrode area A and said photoreceptor layer and between said electrode area A and said semiconductor layer, and ohmic junctions are formed between said photoreceptor layer and said electrode area B and between said semiconductor layer and said electrode area C.

4. A photo electro transducer device according to claim 1, wherein hetero junctions are formed between said electrode area A and said photoreceptor layer and between said electrode area A and said semiconductor layer, and ohmic junctions are formed between said photoreceptor layer and said electrode area B and between said semiconductor layer and said electrode area C.

5. A photo electro transducer device according to claim 1, wherein ohmic junctions are formed between said electrode area A and said photoreceptor layer and between said electrode area A and said semiconductor layer, and hetero junctions are formed between said photoreceptor layer and said electrode area B and between said semiconductor layer and said electrode area C.

6. A photo electro transducer device according to claim 1, wherein ohmic junctions are formed between said electrode area A and said photoreceptor layer and between said electrode area A and said semiconductor layer, ohmic junctions are further formed between said photoreceptor layer and said electrode area B and between said semiconductor layer and said electrode area C, and said semiconductor layer contains a homo junction area.

7. A photo electro transducer device according to claim 1, wherein ohmic junctions are formed between said electrode area A and said photoreceptor layer and between said electrode area A and said semiconductor layer, an ohmic junction is further formed between said photoreceptor area and said electrode area B, and a Shottky junction is formed between said semiconductor layer and said electrode area C.

8. A photo electro transducer device according to claim 1, wherein ohmic junctions are formed between said electrode area A and said photoreceptor layer and between said electrode area A and said semiconductor layer, an ohmic junction is further formed between said photoreceptor layer and said electrode area B, and a hetero junction is formed between said semiconductor layer and said electrode area C.

9. A photo electro transducer device according to claim 1, wherein said crosstalk preventing portion comprises light shielding means.

10. A photo electro transducer device according to claim 1, wherein said photoreceptor layer and said semiconductor layer are mutually separated on said electrode area A.

11. A photo electro transducer device, comprising:
   a photo electro transducer portion composed of n photo electro transducer elements arranged in a linear array of a substantially constant pitch on a substrate and equally divided into N photo electro transducer blocks each containing k photo electro transducer elements;
   a crosstalk preventing portion composed of n diode elements respectively connected in series to said photo electro transducer elements and divided into N diode blocks corresponding to said photo electro transducer blocks;
   a storage section composed of k storage elements each connected to the photo electro transducer elements of the same ordinal position among said k photo electro transducer elements in different photo electro transducer blocks;
   a switching element block composed of k switching elements provided in correspondence with said storage elements, respectively, for transferring the signals stored therein;
   a shift register for controlling said switching elements;
   N switching elements respectively connected in series to said diode blocks; and
   a shift register for controlling said N switching elements;
   wherein each block of k photo electro transducer elements is composed of one of k electrode areas A arranged in an array on said substrate, a photoreceptor layer provided on said electrode area A and an electrode area B provided on said photoreceptor layer, and wherein each of said diode elements is composed of a portion of said electrode area A, an electrode area C and a semiconductor layer provided between said electrode areas A and C.

12. A photo electro transducer device according to claim 11, wherein ohmic junctions are formed between said electrode area A and said photoreceptor layer and between said electrode area A and said semiconductor layer, and Shottky junctions are formed between said photoreceptor layer and said electrode area B and between said semiconductor layer and said electrode area C.

13. A photo electro transducer device according to claim 11, wherein Shottky junctions are formed between said electrode area A and said photoreceptor layer and between said electrode area A and said semiconductor layer, and ohmic junctions are formed between said photoreceptor layer and said electrode area B and between said semiconductor layer and said electrode area C.

14. A photo electro transducer device according to claim 11, wherein hetero junctions are formed between said electrode area A and said photoreceptor layer and between said electrode area A and said semiconductor layer, and ohmic junctions are formed between said photoreceptor layer and said electrode area B and between said semiconductor layer and said electrode area C.

15. A photo electro transducer device according to claim 11, wherein ohmic junctions are formed between said electrode area A and said photoreceptor layer and between said electrode area A and said semiconductor layer, and hetero junctions are formed between said photoreceptor layer and said electrode area B and between said semiconductor layer and said electrode area C.

16. A photo electro transducer device according to claim 11, wherein ohmic junctions are formed between said electrode area A and said photoreceptor layer and between said electrode area A and said semiconductor layer, ohmic junctions are further formed between said photoconductor layer and said electrode area B and between said semiconductor layer and said electrode area C, and said semiconductor layer contains a homo junction area therein.

17. A photo electro transducer device according to claim 11, wherein ohmic junctions are formed between said electrode area A and said photoreceptor layer and between said electrode area A and said semiconductor layer, an ohmic junction is further formed between said photoreceptor layer and said electrode area B, and a Shottky junction is formed between said semiconductor layer and said electrode area C.

18. A photo electro transducer device according to claim 11, wherein ohmic junctions are formed between said electrode area A and said photoreceptor layer and between said electrode area A and said semiconductor layer, an ohmic junction is further formed between said photoreceptor layer and said electrode area B, and a hetero junction is formed between said semiconductor layer and said electrode area C.

19. A photo electro transducer device according to claim 11, wherein said crosstalk preventing portion comprises light shielding means.

20. A photo electro transducer device according to claim 11, wherein said photoreceptor layer and said semiconductor layer are mutually separated on said electrode area A.

21. A photo electro transducer device, comprising:
a photo electro transducer portion composed of plural photo electro transducer elements having respective photoreceptor faces and arranged in an array, each photo electro transducer element being composed of a photoreceptor layer, an electrode A provided on one surface of said photoreceptor layer and an electrode B provided on the other surface of said photoreceptor layer and having a crosstalk preventing diode structure portion formed by contact of said photoreceptor layer with said electrode A and a photo electro transducing photodiode structure portion formed by contact of said photoreceptor layer with said electrode B;
means for causing the photo electro transducer function of said photo electro transducer elements;
storage means for storing the signals output from said photo electro transducer elements; and
transfer means for transferring the signals stored in said storage means.

22. A photo electro transducer device according to claim 21, wherein said diode structure portion and said photodiode structure portion are formed by Shottky junctions.

23. A photo electro transducer device according to claim 21, wherein said diode structure portion and said photodiode structure portion are formed by hetero junctions.

24. A photo electro transducer device according to claim 21, wherein either one of said diode structure portion and said photodiode structure portion is formed by a Shottky junction and the other is formed by a hetero junction.

25. A photo electro transducer device, comprising:
(a) N photo electro transducer blocks each composed of k photo electro transducer elements respectively having photoreceptor faces and arranged in an array, each photo electro-transducer element being composed of a photoreceptor layer, an electrode A provided on one surface of said photoreceptor layer and an electrode B provided on the other surface of said photoreceptor layer and having a crosstalk preventing diode structure portion formed by contact of said photoreceptor layer with said electrode A and a photo electro transducing photodiode structure portion formed by contact of said photoreceptor layer with said electrode B;
(b) a storage section composed of k storage elements each interconnected in series to the photo electro transducer elements in the same ordinal position in different photo electro transducer blocks;
(c) a switching element block composed of k switching elements provided in correspondence with said storage elements, respectively, for performing a switching function for transferring the signals stored in said storage elements;
(d) a shift register for causing the switching function of each of said k switching elements;
(e) N switching elements respectively interconnected in series to said photo electro transducer blocks; and
(f) a shift register for controlling the switching of said N switching elements.

* * * * *